United States Patent
Seon et al.

(10) Patent No.: US 8,252,883 B2
(45) Date of Patent: Aug. 28, 2012

(54) ORGANOSILICON NANOCLUSTER, METHOD OF PREPARING THE SAME AND METHOD OF FORMING THIN FILM USING THE SAME

(75) Inventors: Jong Baek Seon, Seoul (KR); Hyun Dam Jeong, Seoul (KR); Sang Yoon Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1093 days.

(21) Appl. No.: 11/907,878

(22) Filed: Oct. 18, 2007

(65) Prior Publication Data

US 2008/0206479 A1 Aug. 28, 2008

(30) Foreign Application Priority Data

Feb. 23, 2007 (KR) .................. 10-2007-0018484

(51) Int. Cl.
*C08G 77/00* (2006.01)
*C08G 77/20* (2006.01)
*C08F 283/00* (2006.01)
*C08F 283/12* (2006.01)

(52) U.S. Cl. ............ 528/32; 528/43; 977/773; 977/774; 525/479

(58) Field of Classification Search .............. 528/43, 528/32; 977/773, 774; 525/479
See application file for complete search history.

(56) References Cited

U.S. PATENT DOCUMENTS

| | | | | |
|---|---|---|---|---|
| 6,117,366 A | * | 9/2000 | Park et al. | 252/512 |
| 6,864,329 B2 | * | 3/2005 | Xiao et al. | 525/474 |
| 6,995,215 B2 | * | 2/2006 | Dvornic et al. | 525/474 |
| 7,338,689 B2 | * | 3/2008 | Shin et al. | 427/387 |
| 7,358,525 B2 | * | 4/2008 | Lee | 257/22 |
| 2002/0106513 A1 | * | 8/2002 | Matyjaszewski et al. | 428/404 |
| 2003/0003300 A1 | * | 1/2003 | Korgel et al. | 428/402 |
| 2003/0054948 A1 | * | 3/2003 | Pinnavaia et al. | 502/158 |
| 2003/0096113 A1 | * | 5/2003 | Jacobson et al. | 428/379 |
| 2003/0120099 A1 | * | 6/2003 | Laine et al. | 556/450 |
| 2004/0072231 A1 | * | 4/2004 | Mirkin et al. | 435/6 |
| 2004/0146560 A1 | * | 7/2004 | Whiteford et al. | 424/484 |
| 2004/0171482 A1 | * | 9/2004 | Pinnavaia et al. | 502/158 |
| 2004/0236057 A1 | * | 11/2004 | Chevalier et al. | 528/42 |
| 2005/0004293 A1 | * | 1/2005 | Peng et al. | 524/439 |
| 2005/0205849 A1 | * | 9/2005 | Whiteford et al. | 252/500 |
| 2005/0264976 A1 | * | 12/2005 | Hill | 361/303 |

(Continued)

FOREIGN PATENT DOCUMENTS

EP 1000949 A1 * 5/2000
JP 2004277413 A * 10/2004

OTHER PUBLICATIONS

Machine Translation of JP 2004277413 A, 2011.*

(Continued)

*Primary Examiner* — Liam Heincer
(74) *Attorney, Agent, or Firm* — Harness, Dickey & Pierce, P.L.C.

(57) ABSTRACT

Disclosed herein is an organosilicon nanocluster, wherein a silicon cluster is substituted with a conductive organic material, a silicon thin film including the same, a thin film transistor including the silicon thin film, a display device including the thin film transistor, and methods of forming the same. The organosilicon nanocluster may more easily and efficiently form a thin film while maintaining electrical characteristics of an amorphous silicon thin film.

23 Claims, 2 Drawing Sheets

U.S. PATENT DOCUMENTS

| | | | |
|---|---|---|---|
| 2006/0060998 A1* | 3/2006 | Strouse et al. | 264/5 |
| 2006/0063012 A1* | 3/2006 | Shin et al. | 428/447 |
| 2006/0083925 A1* | 4/2006 | Laine et al. | 428/405 |
| 2006/0088713 A1* | 4/2006 | Dykstra et al. | 428/402 |
| 2006/0199886 A1* | 9/2006 | Ryang | 524/262 |
| 2006/0234151 A1* | 10/2006 | Nakagawa et al. | 430/234 |
| 2007/0174939 A1* | 7/2007 | Sargent et al. | 977/742 |
| 2007/0208123 A1* | 9/2007 | Kambe et al. | 524/432 |
| 2007/0282122 A1* | 12/2007 | Holland et al. | 556/466 |
| 2007/0287848 A1* | 12/2007 | Nakagawa | 556/400 |
| 2008/0160323 A1* | 7/2008 | Mosley et al. | 428/447 |
| 2008/0207864 A1* | 8/2008 | Nakagawa et al. | 528/25 |
| 2009/0042136 A1* | 2/2009 | Tour et al. | 430/296 |
| 2009/0286068 A1* | 11/2009 | Niguma et al. | 428/327 |
| 2010/0062539 A1* | 3/2010 | Frederick et al. | 436/173 |
| 2010/0136769 A1* | 6/2010 | Keshavarz et al. | 438/478 |

OTHER PUBLICATIONS

William L. Wilson et al. "Quantum Confinement in Size-Selected, Surface-Oxidized Silicon Nanocrystals". Science vol. 262, p. 1242-1244. Nov. 19, 1993.

A. Littau et al. "A Luminescent Silicon Nanocrystal Colloid via a High-Temperature Aerosol Reaction". J.Phys. Chem. p. 1224-1230, 1997.

Shoji Furukawa et al. "Three-Dimensional Quantum Well Effects in Ultrafine Silicon Particles". Japanese Journal of Applied Physics. vol. 27, No. 11 p. L2207-L2209. Nov. 1988.

H. Takagi et al. "Quantum size effects on photoluminescence in ultrafine Si particles". Appl. Phys. Lett. 56, p. 2379-2380, 1990.

D. Zhang et al. "Light emission from thermally oxidized silicon nanoparticles". Appl. Phys. Lett. 65, p. 2684-2686. 1994.

Xiaoshuang Chen et al. "The effect of size distribution of Si nanoclusters on photoluminescence from ensembles of Si nanoclusters". Physics Letters A 212, p. 285-289, 1996.

Akira Watanabe et al. "Field-effect transistor based on organosoluble germanium nanoclusters". Applied Organometallic Chemistry. 19, p. 530-537. 2005.

Tatsuya Shimoda et al. "Solution-processed silicon films and transistors". vol. 440, p. 783-786. Apr. 6, 2006.

Akira Watanabe et al. "Soluble Three-Dimensional Polysilane with Organosilicon Nanocluster Structure". Japanese Journal Applied Physics. vol. 36, p. 1265-1267. Sep. 15, 1997.

* cited by examiner icon nanocluster, a silicon thin film including the same, a thin film transistor including the silicon thin film, a display device including the thin film transistor, and methods of forming the same. Other example embodiments relate to an organosilicon nanocluster in which a silicon cluster may be substituted with a conductive organic material, a silicon thin film including the same, a thin film transistor including the silicon thin film, a display device including the thin film transistor, and methods of forming the same.

2. Description of the Related Art

Amorphous silicon is a material of driving parts for solar cell and/or TFT-LCD technology, and research into applications thereof has been conducted. However, because the amorphous silicon is formed using a conventional vapor deposition method, there may be problems in that decreasing the manufacturing cost and producing relatively large-sized products may be difficult.

As an attempt to decrease the manufacturing cost and to produce relatively large-sized products, organic silane compounds have been researched as relatively high-functional organic materials. However, straight-chain polysilane, which is considered to overcome the problems, may have insufficient stability. Polysilane, which is a low-dimensional silane compound, may offer suitable semiconductor characteristics, but may lack effective means for p-n control. In one-dimensional materials, even if elements, e.g., phosphorus and/or boron, are introduced into main chains of the materials, only trap sites may be left in the material, thereby obtaining insufficient results. When the material is doped with Lewis acid or Lewis base, stability may be decreased. Straight-chain polysilane compounds may not be used as a silicon precursor because the main chains of the straight-chain polysilanes may be decomposed and then vaporized while organic groups may be separated from the straight-chain compounds.

Because network polysilane, which is a polysilane compound having branched silicon chains, is soluble in an organic solvent, a thin film may be more easily formed. However, because organic substitution groups of the thin film prevent or reduce a carrier from migrating between silicon backbones, the network polysilane may not exhibit improved semiconductor characteristics compared to the straight-chain polysilane compounds. Because the network polysilane has a network structure and thus has improved heat resistance, an amorphous silicon thin film may be formed through heat treatment. However, because the amorphous silicon thin film has many residual organic substitution groups, the amorphous silicon thin film may have undesirable electrical properties compared to original amorphous silicon, and there are no methods suitable for doping phosphorus and/or boron.

Amorphous silicon having the same effect as that obtained through conventional vapor deposition methods may be obtained by heating t-butyloctasilacubane used as a precursor. However, because the t-butyloctasilacubane, which is a crystalline compound, may form a thin film only through vapor deposition methods, the thickness of the formed thin film may also be nonuniform.

There are technologies for removing organic materials, in which soluble silicon cluster precursors may be prepared by synthesizing silicon clusters, a thin film may be formed on the precursors, and then the thin film may be heat-treated. However, removing organic materials and controlling defects derived from the removed organic materials may be relatively difficult, and the conductivity of the thin film may be decreased.

SUMMARY

Accordingly, example embodiments have been made to overcome the above problems occurring in the related art, and example embodiments provide an organosilicon nanocluster which may easily and efficiently form a thin film while maintaining electrical characteristics of an amorphous silicon thin film. Example embodiments also provide a silicon thin film including the same, a thin film transistor including the silicon thin film, and a display device including the thin film transistor. Example embodiments also provide a method of preparing the organosilicon nanocluster. Other example embodiments also provide a method of forming an organosilicon thin film using the organosilicon nanocluster as a precursor. Example embodiments also provide methods of fabricating a thin film transistor including forming the silicon thin film and a display device including fabricating the thin film transistor.

Example embodiments provide an organosilicon nanocluster, in which a silicon cluster may be substituted with a conductive organic material. Other example embodiments provide a method of preparing an organosilicon nanocluster, including substituting a conductive organic material with alkali metals or alkali earth metals, and reacting the conductive organic material substituted with alkali metals or alkali earth metals with a silicon cluster, thereby substituting the silicon cluster with the conductive organic material.

Example embodiments provide a method of forming a silicon thin film, including dissolving the organosilicon nanocluster of example embodiments in an organic solvent to form a mixed solution, and then applying the mixed solution on a substrate, thereby forming a thin film, and forming a conducting wire between the organosilicon nanoclusters by irradiating ultraviolet radiation or applying heat to the thin film.

BRIEF DESCRIPTION OF THE DRAWINGS

Example embodiments will be more clearly understood from the following detailed description taken in conjunction with the accompanying drawings.

FIG. 1 is a schematic view illustrating a process of forming a conducting wire due to the non-covalent intermolecular forces between conductive materials of nanoclusters according to example embodiments;

FIG. 2 is a schematic view illustrating a process of forming a conducting wire due to the covalent chemical bonds between conductive materials of nanoclusters according to example embodiments; and FIG. 3 is a graph illustrating an infrared spectrum which confirms that a conducting wire is formed between silicon clusters.

Figure 1:
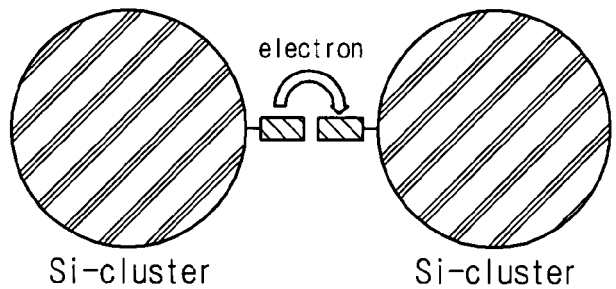
FIGS. 1-3 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Hereinafter, example embodiments will be described in detail with reference to the attached drawings. Reference now should be made to the drawings, in which the same reference numerals are used throughout the different drawings to designate the same or similar components. In the drawings, the thicknesses and widths of layers are exaggerated for clarity. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The organosilicon nanocluster of example embodiments may be characterized in that a silicon cluster may be substituted with a conductive organic material. Because a silicon cluster is substituted with a conductive organic material, the organosilicon nanocluster may be dissolved in an organic solvent.

The silicon nanocluster may be silicon having a three-dimensional structure. The composition and characteristics thereof are disclosed in W. L. Wilson, P. F. Szajowski, L. E. Brus, Science 262, 1242 (1993), A. Littau, P. J. Szajowski, A. R. Muller, A. R. Kortan, and L. E. Brus, J. Phys. Chem. 97, 1224 (1993), S. Furukawa and T. Miyasato, Jpn, J. Appl. Phys. 27, L2207 (1989), T. Takagi, H. Ogawa, Y. Yamazaki, A. Ishizaki, and T. Nalagiri, Appl. Phys. Lett. 56, 2379 (1990), D. Zhang, R. M. Kolbas, P. D. Milewski, D. J. Lichtenwalner, A. I. Kingon, and J. M. Zavada, Appl. Phys. Lett. 65, 2684 (1994), X. Chen, J. Zhao, G. Wang, X. Shen, Phys. Lett. 212, 285 (1996).

The organic material may not be limited provided that the organic material is conductive. Polyacetylene, poly(p-phenylene), polythiophene, poly(p-phenylene vinylene) and/or polyaniline may be known as a conductive polymer. The conductive organic material which may be used in example embodiments may include, but may not be limited to, aromatic cyclic compounds including acetylene, thiophene, and aniline, which are monomers forming the conductive polymer, and organic materials having a conjugated structure in which single bonds and double bonds (or triple bonds), which are backbones of the conductive organic material, are alternately repeated. The conductive organic material may be represented by the following Formula 1 or Formula 2

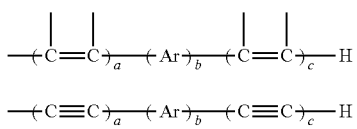

[Formula 1]

[Formula 2]

In Formula 1 or 2, Ar may be a substituted or unsubstituted heteroaryl group or heteroarylene group of about 2 to about 30 carbon atoms, or a substituted or unsubstituted aryl group or arylene group of about 6 to about 30 carbon atoms, and a, b and c are from about 0 to about 20, respectively (provided that a+b+c>0).

The hetero arylene group, which may be used in the organosilicon nanocluster of example embodiments, may be substituted with one or more hetero atoms selected from the group consisting of S, O, N and Se, and the heteroaryl group, heteroarylene group, aryl group or arylene group may be substituted with a hydroxyl group, a linear, branched or cyclic alkyl group of about 1 to about 20 carbon atoms, an alkoxyalkyl group of about 1 to about 20 carbon atoms, a linear, branched or cyclic alkoxy group of about 1 to about 16 carbon atoms, or one or more selected from among F, Br, Cl, and I.

In Formula 1 or 2, the Ar may be selected from the group represented by the following Formula 3.

[Formula 3]

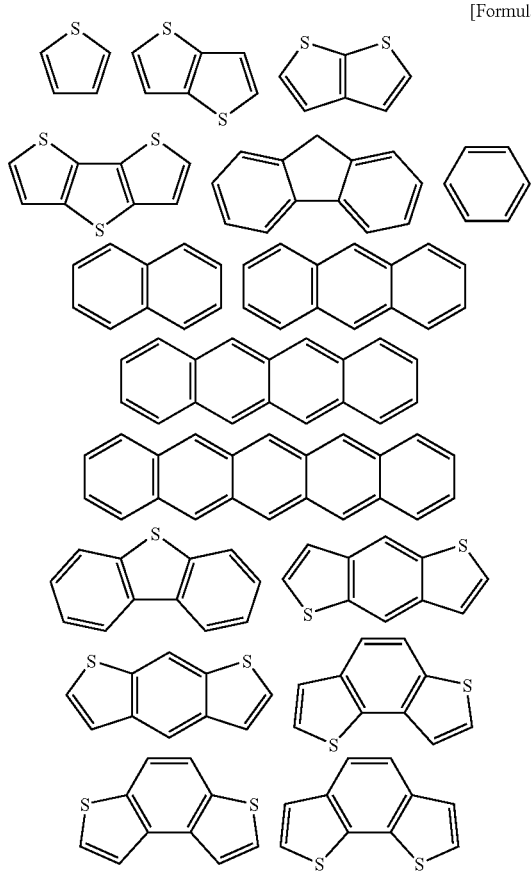

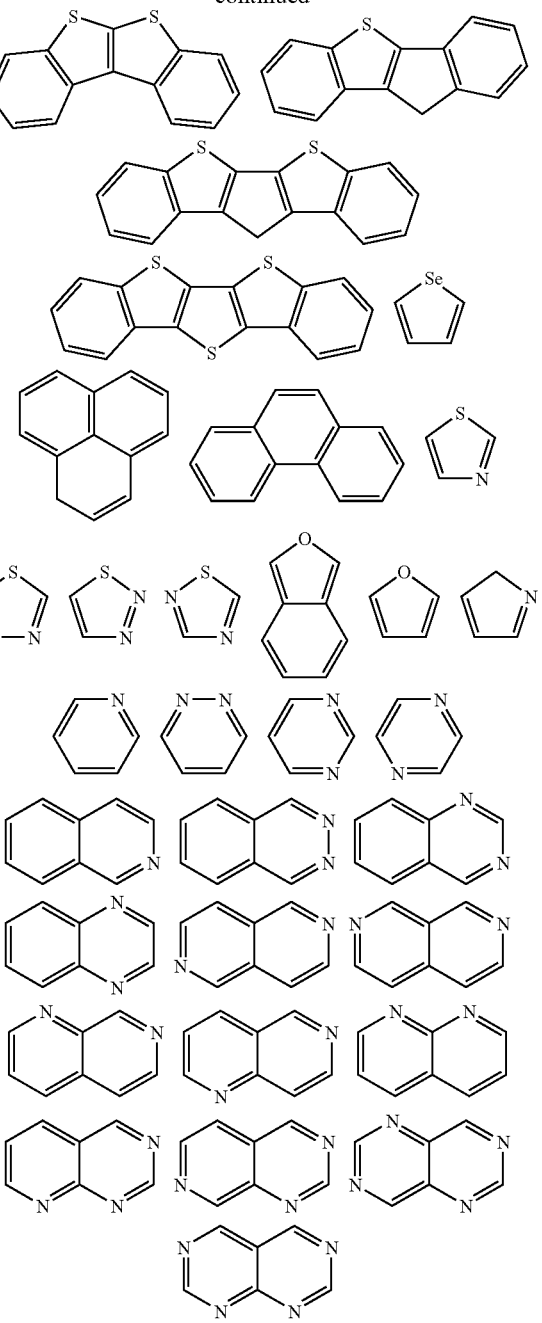

The conductive organic material, with which the organosilicon nanocluster of example embodiments is substituted, may be selected from the group represented by the following Formula 4, but may not be limited thereto.

[Formula 4]

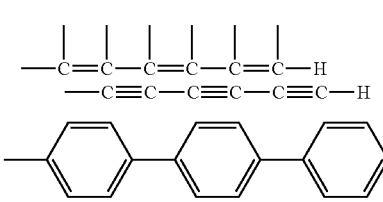

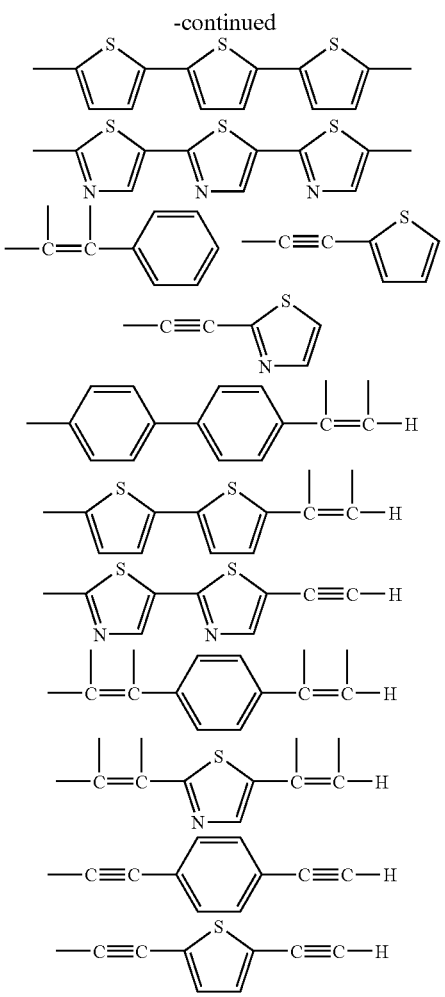

Example embodiments provide a method of preparing an organosilicon nanocluster, including substituting an conductive organic material, represented by the following Formula 5 or 6, with alkali metals or alkali earth metals, and reacting the conductive organic material substituted with alkali metals or alkali earth metals with a silicon cluster, thereby substituting the silicon cluster with the conductive organic material.

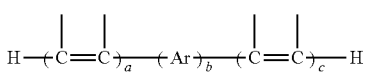
[Formula 5]

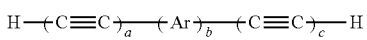
[Formula 6]

In Formula 5 or 6, Ar is a substituted or unsubstituted heteroaryl group or heteroarylene group of about 2 to about 30 carbon atoms, or a substituted or unsubstituted aryl group or arylene group of about 6 to about 30 carbon atoms, and a, b and c are from about 0 to about 20, respectively (provided that a+b+c>0).

The method of preparing an organosilicon nanocluster further may include substituting halogen remaining in the organosilicon nanocluster obtained during the reaction of the conductive organic material substituted with alkali metals or alkali earth metals with a silicon cluster with hydrogen using lithiumaluminumhydride ($LiAlH_4$). Hereinafter, the method of preparing an organosilicon nanocluster will be described in detail.

In order to prepare an organosilicon nanocluster using the method of example embodiments, a conductive organic material may be substituted with alkali metals and/or alkali earth metals. Organic materials, represented by the above Formula 5 or 6, may be used as the conductive organic material, but the conductive organic material may not be limited provided that the organic material has conductivity.

In addition to the conductive materials, alkali metals or alkali earth metals containing compounds may also be used as a reactant. The alkali metal or alkali earth metal, which may be used in example embodiments, may be selected from the group consisting of Li, Na, K, Rb, Be, Mg, and Ca, but may not be limited thereto. The substitution reaction may be performed using commonly known methods, and the conductive organic material and metal may be ionic bonded using the method.

A conductive organic material substituted with alkali metals or alkali earth metals may be obtained, and then the obtained conductive organic material may react with a silicon cluster, thereby obtaining a silicon nanocluster substituted with the conductive organic material.

A halogenated silane and an alkali metal or an alkali earth metal, e.g., sodium and/or magnesium, may be dissolved in a solvent, e.g., tetrahydrofuran (THF), benzene and/or toluene, and then a substitution reaction may be conducted, thereby obtaining a silicon cluster solution. Subsequently, the obtained silicon cluster solution may mix and react with the conductive organic material substituted with alkali metals or alkali earth metals obtained as above, thereby substituting the silicon cluster with the conductive organic material. The substitution reaction may be conducted using commonly known substitution reaction methods.

Substituting hydrogen for halogen remaining in the organosilicon nanocluster may be further included in order to prevent or reduce the oxidation of the organosilicon nanocluster substituted with the conductive organic material obtained above. Substituting hydrogen for halogen remaining in the organosilicon nanocluster may reduce the organosilicon nanocluster obtained using lithiumaluminumhydride ($LiAlH_4$). The lithiumaluminumhydride ($LiAlH_4$), which is a relatively strong reductant, may serve to substitute hydrogen for halogen remaining in the organosilicon nanocluster obtained, and thus prevent or retard the organosilicon nanocluster from being oxidized.

Example embodiments provide a method of forming a silicon thin film, including dissolving the organosilicon nanocluster of example embodiments in an organic solvent to form a mixed solution, and then applying the mixed solution on a substrate, thereby forming a thin film, and forming a conducting wire between the organosilicon nanoclusters by irradiating ultraviolet radiation or applying heat to the thin film formed in dissolving the organosilicon nanocluster of example embodiments. Hereinafter, the method of forming a silicon thin film of example embodiments will be described in detail.

Forming an organosilicon nanocluster thin film may include dissolving the organosilicon nanocluster of example embodiments in an organic solvent to form a mixed solution, and then applying the mixed solution on a substrate, thereby forming a thin film.

The organosilicon nanocluster of example embodiments may be soluble in an organic solvent, and the organic solvent may be selected from the group consisting of a hydrocarbon solvent, an alcohol solvent, an ether solvent, an aromatic solvent, and a polar solvent, but may not be limited thereto.

The organosilicon nanocluster may be dissolved in the organic solvent such that an amount thereof may be in the range of about 0.1 wt %~about 50 wt %, and may be applied on a substrate. The coating method may be selected from the group consisting of a screen printing method, a printing method, a spin coating method, a dipping method, and an ink spraying method, but may not be limited thereto.

The conducting wire may be formed by chemical bonds between conductive organic materials, dispersion force, electrical attractive force, hydrogen bonds and/or a combination thereof. The conducting wire may be formed through a reaction between the conductive organic materials of the organosilicon nanocluster by applying heat or irradiating ultraviolet radiation on the thin film formed during formation of an organosilicon nanocluster thin film. The conducting wire may be formed through a condensation reaction between the molecules located at the ends of the conductive organic materials. The condensation reaction may be conducted by applying heat at about 100° C.~about 500° C. for about 1 minute~about 3 hours and/or irradiating ultraviolet radiation on the thin film.

Examples of the conducting wire formed between the organosilicon nanoclusters according to example embodiments may be represented by the following Formula 7, but may not be limited thereto.

attractive force and/or hydrogen bonds between conductive organic materials. Accordingly, when the conducting wire is formed between the organosilicon nanoclusters, electrons may migrate through the conducting wire.

Figure 2:
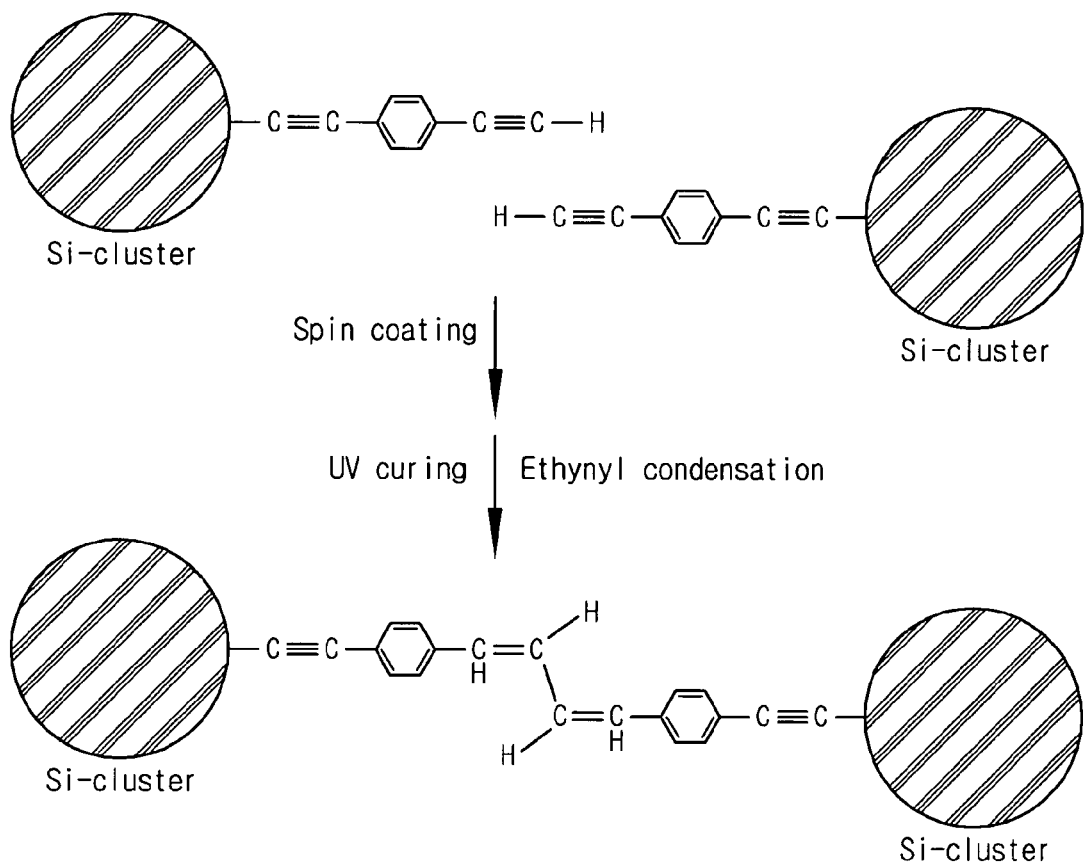

FIG. 2 illustrates a process of forming a conducting wire due to the chemical bonds between conductive materials of nanoclusters according to example embodiments. Referring to FIG. 2, in the case where the ends of conductive organic materials are ethynyl groups, when UV is irradiated or heat is applied thereto after the formation of a thin film, a condensation reaction may occur between the ethynyl groups, so that the conductive organic materials may be chemically bonded to each other, thereby forming a conducting wire.

Example embodiments provide a silicon thin film formed of precursors, in which the precursors are the organosilicon nanoclusters of example embodiments. The silicon thin film of example embodiments may include a conducting wire selected from the group represented by the above Formula 7. Example embodiments provide a thin film transistor including the silicon thin film of example embodiments.

Example embodiments also provide an electronic device comprising the thin film transistor of example embodiments. Because the organosilicon nanocluster of example embodiments included in the silicon thin film serves to improve the device characteristics of a thin film transistor, the silicon thin film may be effectively used to fabricate a variety of elec-

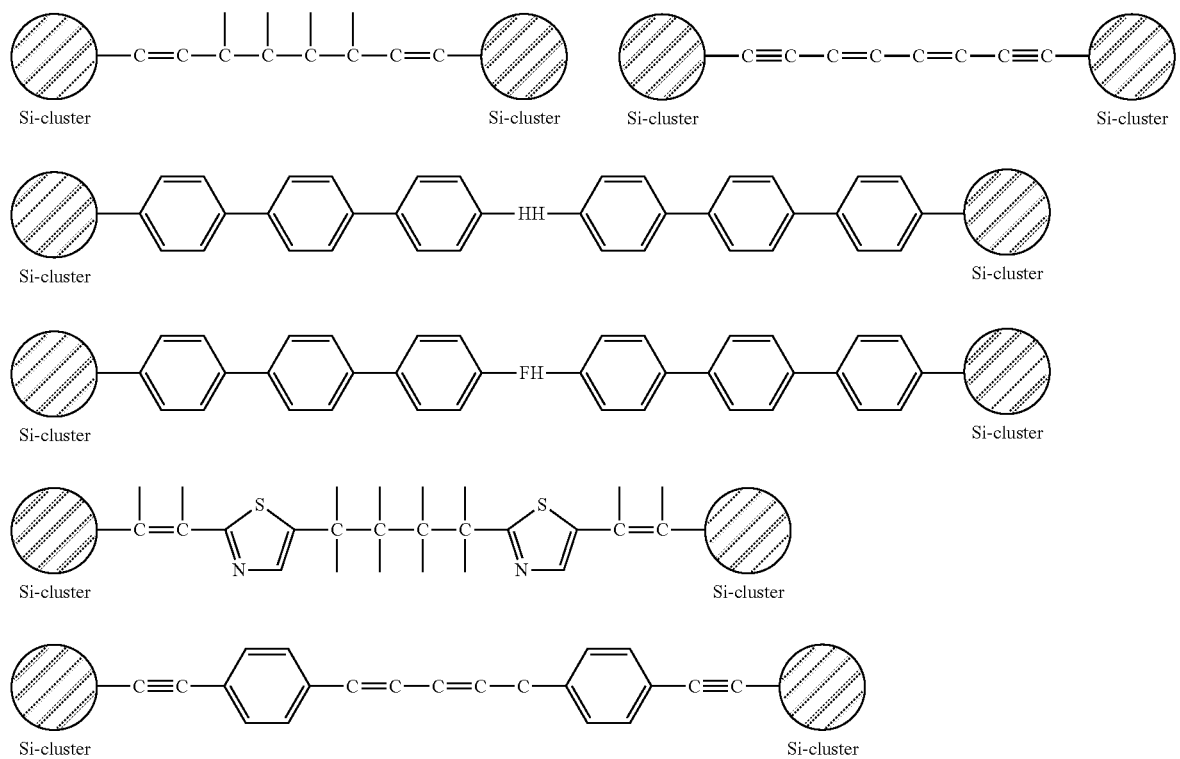

[Formula 7]

FIG. 1 illustrates a process of forming a conducting wire due to the intermolecular forces between conductive materials of silicon nanoclusters according to example embodiments. Referring to FIG. 1, the conducting wire between the organosilicon nanoclusters according to example embodiments may be formed due to the dispersion force, electrical tronic devices, including liquid crystal display (LCD) devices, solar cells, photovoltaic devices, organic light-emitting devices (OLEDs), sensors, memory devices and/or integrated circuits. These electronic devices may be fabricated using the silicon thin film of example embodiments by any common process.

Hereinafter, example embodiments will be described in detail with reference to Examples. These Examples are set forth to illustrate example embodiments, but should not be construed as the limit of example embodiments.

Example 1

Preparation of an organosilicon nanocluster

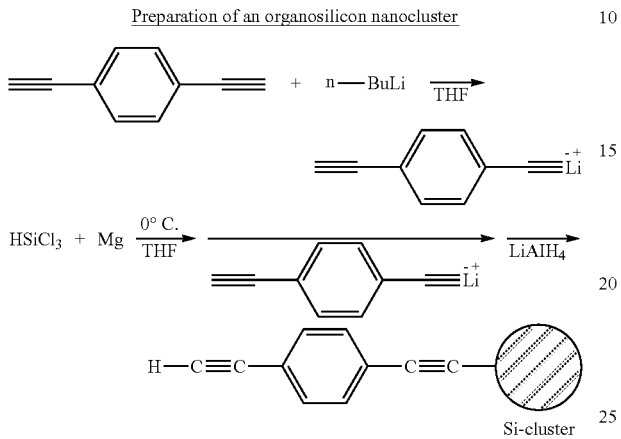

About 6.0 g (about 48 mmol) of diethynylbenzene was dissolved in about 40 mL of anhydrous THF, and the mixture was put in an about 100 mL 2-neck flask provided with a reflux condenser. Then, the flask was placed on a heating mantle, and the mixture put in the flask was stirred using a magnetic bar. Subsequently, about 33.26 mL of about 1.6 M butyl lithium (hexane was used as a solvent) was slowly added to the stirred solution at a rate of about 0.1 mL/min, and the mixed solution was reacted at a temperature of about 100° C. for about 2 hours, thus the diethynylbenzene was substituted with lithium ion.

Trichlorosilane (about 3.8 g, about 28.1 mmol) and Mg (about 1.9 g, about 78.2 mmol) was dissolved in tetrahydrofuran in an about 100 ml 3-neck flask, and the mixture was reacted using an ultrasonicator at a temperature of about 0° C. for about 4 hours, thereby obtaining a silicon cluster solution. An organosilicon cluster was extracted from the silicon cluster solution by removing the solvent, e.g., THF, under reduced pressure, thereby obtaining golden yellow solid. Subsequently, the obtained solid was dissolved in about 40 ml of THF in an Erlenmeyer flask. Then, about 0.13 g (about 7 mmol) of LiAlH$_4$ was dissolved in about 60 mL of THF, and the mixture was put in an about 250 mL 2-neck flask provided with a reflux condenser. Subsequently, the THF solution containing the golden yellow solid was slowly added from the Erlenmeyer flask to the 2-neck flask, which was stirred using a magnetic bar for about 15 hours. After the reaction was completed, the solvent including THF was removed from the stirred solution, and golden yellow nanocluster (about 3.1 g) was thus obtained from the product mixture remaining in the flask using about 100 mL of anhydrous benzene again.

Formation of a Silicon Thin Film

The powder obtained in Example 1 was dissolved in benzene in the amount of about 5 wt %, and the solution was then spin-coated on a silicon wafer substrate at a speed of about 500 rpm for about 30 seconds, thereby forming a thin film. Subsequently, the thin film was left on a hot plate at about 100° C. under a N$_2$ atmosphere for about 1 minute, and thus the solvent remaining in the thin film was removed. Then, the thin film was irradiated with UV using an about 200W Hg—Xe lamp for about 10 minutes, thereby obtaining a silicon thin film in which a conducting wire is formed between the silicon clusters.

Example 2

The silicon thin film in which a conducting wire was formed between the silicon clusters was obtained as in Example 1, except that the thin film was irradiated with UV using an about 200W Hg—Xe lamp for about 10 minutes and was heat-treated at a temperature of about 300° C. for about 30 minutes after the thin film of Example 1 was formed.

Comparative Example 1

The silicon thin film was obtained in which UV irradiation and heat treatment were not performed after the thin film of Example 1 was formed.

Figure 3:
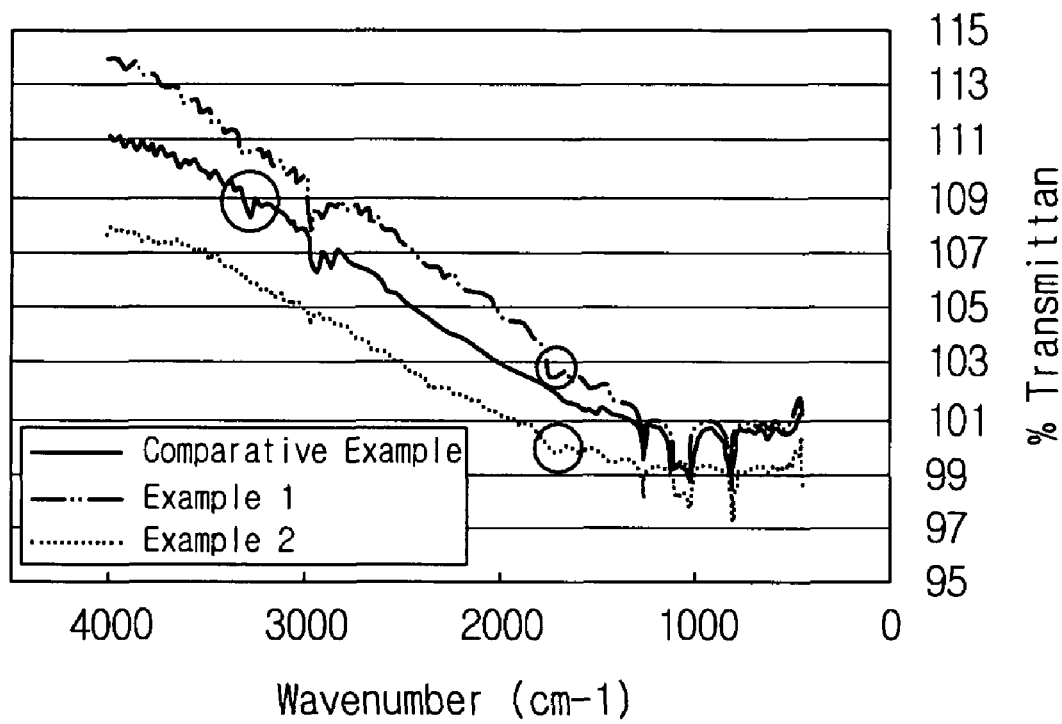

FIG. 3 is a graph illustrating an infrared spectrum which may confirm whether a conducting wire is formed between silicon clusters. In Examples 1 and 2, unlike Comparative Example 1, peaks in the range of about 3250 cm$^{-1}$, corresponding to carbon triple bonds, were decreased, and peaks in the range of about 1700 cm$^{-1}$ were increased, thereby forming carbon double bonds. Accordingly, condensation reactions were conducted between ethynyl groups, which are ends of conductive organic materials, and thus a conducting wire was formed between molecules of the conductive organic materials.

As described above, the organosilicon nanocluster according to example embodiments may exhibit conductivity because the organosilicon nanocluster may include conductive organic materials, may form a silicon thin film without using a vapor deposition method because the organosilicon nanocluster may be dissolved in an organic solvent, and may maintain electrical conductivity even if organic materials are not removed after the formation of a thin film. Accordingly, when the organosilicon nanocluster is used for organic thin film transistors, the manufacturing cost may be decreased, and large-sized transistors may be produced.

Although example embodiments have been disclosed for illustrative purposes, those skilled in the art will appreciate that various modifications, additions and substitutions are possible, without departing from the scope and spirit of the accompanying claims.

What is claimed is:

1. An organosilicon nanocluster, wherein a silicon cluster is substituted with a conductive organic material represented by the following Formula 1 or 2:

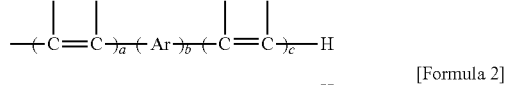

wherein,
Ar is a substituted or unsubstituted heteroaryl group or heteroarylene group of about 2 to about 30 carbon atoms, or a substituted or unsubstituted aryl group or arylene group of about 6 to about 30 carbon atoms, and
a, b and c are from about 0 to about 20, respectively (provided that a+b+c>0, at least one of a+b and b+c≧2, and at least one of a and c is ≧1).

2. The organosilicon nanocluster according to claim 1, wherein the organosilicon nanocluster is soluble in an organic solvent.

3. The organosilicon nanocluster according to claim 1, wherein the hetero arylene group includes one or more hetero atoms selected from the group consisting of S, O, N and Se, and wherein the heteroaryl group, heteroarylene group, aryl group or arylene group is substituted with a hydroxyl group, a linear, branched or cyclic alkyl group of about 1 to about 20 carbon atoms, an alkoxyalkyl group of about 1 to about 20 carbon atoms, a linear, branched or cyclic alkoxy group of about 1 to about 16 carbon atoms, or one or more selected from among F, Br, Cl, and I.

4. The organosilicon nanocluster according to claim 1, wherein the Ar is selected from the group represented by the following Formula 3:

[Formula 3]

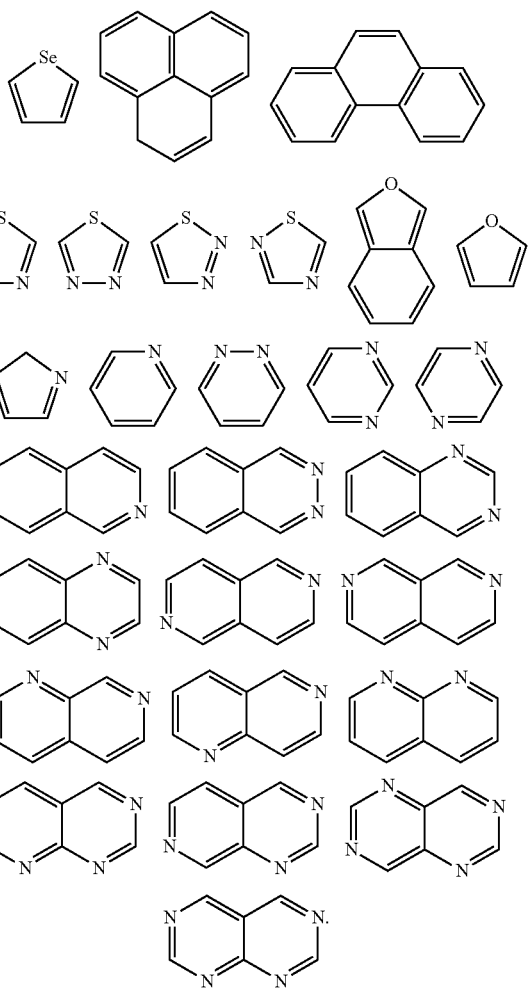

5. The organosilicon nanocluster according to claim 1, wherein the conductive organic material is selected from the group represented by the following Formula 4:

[Formula 4]

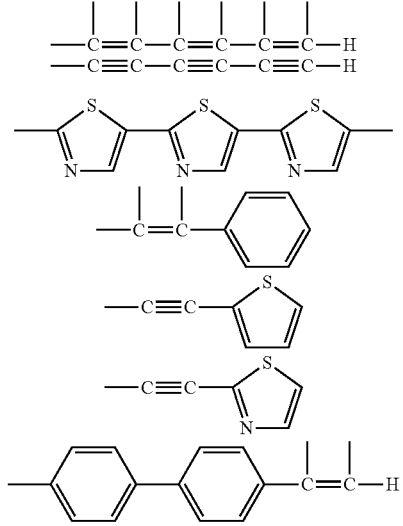

-continued

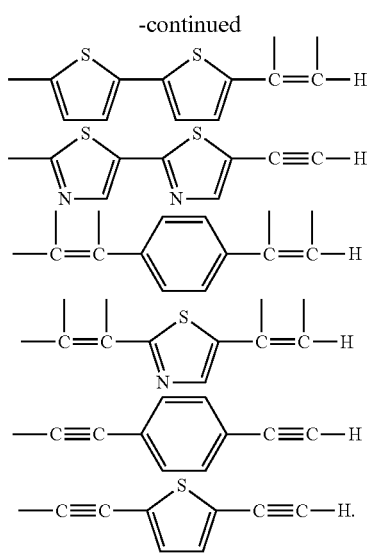

6. A silicon thin film formed of precursors, wherein the precursors are the organosilicon nanocluster according to claim 1.

7. The silicon thin film of claim 6, further comprising:
a conducting wire selected from the group represented by the following Formula 7:

8. A thin film transistor comprising the silicon thin film according to claim 7.

9. A display device comprising the thin film transistor according to claim 8.

10. The display device according to claim 9, wherein the display device is a liquid crystal display or solar cell.

11. A method of preparing an organosilicon nanocluster, comprising:
  substituting a conductive organic material, represented by the following Formula 5 or 6, with alkali metals or alkali earth metals; and
  reacting the conductive organic material substituted with alkali metals or alkali earth metals with a silicon cluster, thereby substituting the silicon cluster with the conductive organic material:

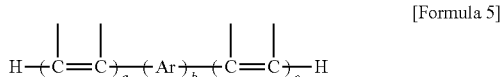 [Formula 5]

 [Formula 6]

wherein,

[Formula 7]

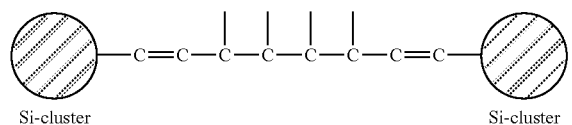  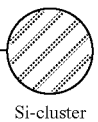

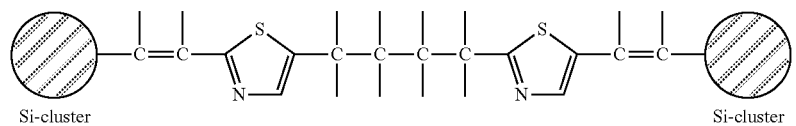

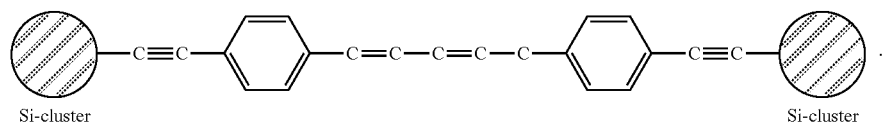

Ar is a substituted or unsubstituted heteroaryl group or heteroarylene group of about 2 to about 30 carbon atoms, or a substituted or unsubstituted aryl group or arylene group of about 6 to about 30 carbon atoms, and a, b and c are from about 0 to about 20, respectively (provided that a+b+c>0, at least one of a+b and b+c≧2, and at least one of a and c is ≧1).

12. The method of preparing an organosilicon nanocluster according to claim 11, further comprising:
   substituting hydrogen for halogen remaining in the organosilicon nanocluster obtained using lithiumaluminumhydride (LiAlH$_4$).

13. The method of preparing an organosilicon nanocluster according to claim 11, wherein the alkali metal or alkali earth metal is selected form the group consisting of Li, Na, K, Rb, Be, Mg, and Ca.

14. A method of forming a silicon thin film, comprising:
   dissolving the organosilicon nanocluster prepared according to claim 11 in an organic solvent to form a mixed solution, and then applying the mixed solution on a substrate, thereby forming a thin film; and
   forming a conducting wire between the organosilicon nanoclusters by irradiating ultraviolet radiation or applying heat to the thin film.

15. The method of forming a silicon thin film according to claim 14, wherein the organic solvent is selected from the group consisting of a hydrocarbon solvent, an alcohol solvent, an ether solvent, an aromatic solvent, and a polar solvent.

16. The method of forming a silicon thin film according to claim 14, wherein the organosilicon nanocluster is dissolved in the organic solvent such that an amount thereof is in the range of about 0.1 wt %~about 50 wt %.

17. The method of forming a silicon thin film according to claim 14, wherein the thin film is formed on the substrate using a coating method selected from the group consisting of a screen printing method, a printing method, a spin coating method, a dipping method, and an ink spraying method.

18. The method of forming a silicon thin film according to claim 14, wherein the conducting wire is formed by chemical bonds between conductive organic materials, dispersion force, electrical attractive force, hydrogen bonds, or a combination thereof.

19. The method of forming a silicon thin film according to claim 18, wherein the chemical bonds are formed through a condensation reaction by applying heat at about 100~about 500☐ for about 1 minute~about 3 hours or irradiating ultraviolet radiation on the thin film.

20. The method of forming a silicon thin film according to claim 14, wherein the conducting wire formed between the organosilicon nanoclusters is selected from the group represented by the following Formula 7:

[Formula 7]

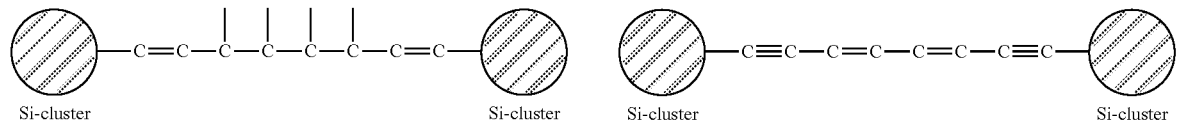

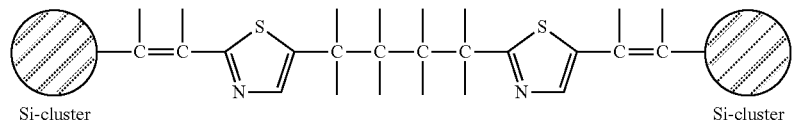

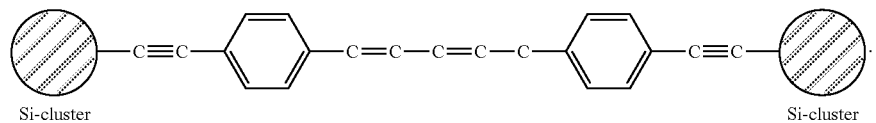

21. A method of fabricating a thin film transistor comprising forming the silicon thin film according to claim 14.

22. A method of fabricating a display device comprising fabricating the thin film transistor according to claim 21.

23. The method of fabricating the display device according to claim 22, wherein the display device is a liquid crystal display or solar cell.

* * * * *